(12) United States Patent
Morita

(10) Patent No.: US 10,777,374 B2
(45) Date of Patent: Sep. 15, 2020

(54) SWITCHING DEVICE, MOVABLE BODY, POWER SUPPLY SYSTEM AND SWITCHING METHOD

(71) Applicant: Sony Corporation, Tokyo (JP)

(72) Inventor: Tadashi Morita, Tokyo (JP)

(73) Assignee: Sony Corporation, Tokyo (JP)

( * ) Notice: Subject to any disclaimer, the term of this patent is extended or adjusted under 35 U.S.C. 154(b) by 396 days.

(21) Appl. No.: 15/754,409

(22) PCT Filed: Oct. 19, 2015

(86) PCT No.: PCT/JP2015/079410
§ 371 (c)(1),
(2) Date: Feb. 22, 2018

(87) PCT Pub. No.: WO2017/037959
PCT Pub. Date: Mar. 9, 2017

(65) Prior Publication Data
US 2018/0254158 A1   Sep. 6, 2018

(30) Foreign Application Priority Data

Sep. 4, 2015 (JP) ................. 2015-174495

(51) Int. Cl.
*H01H 33/59* (2006.01)
*H01H 9/54* (2006.01)
(Continued)

(52) U.S. Cl.
CPC ............ *H01H 33/59* (2013.01); *H01H 3/001* (2013.01); *H01H 9/42* (2013.01); *H01H 9/54* (2013.01);
(Continued)

(58) Field of Classification Search
CPC ...... H01H 33/59; H01H 9/542; H01H 33/596; H01H 3/001; H01H 9/42; H01H 9/54; H01H 13/64; H03K 17/0814
(Continued)

(56) References Cited

U.S. PATENT DOCUMENTS

2007/0064356 A1   3/2007 Wakatsuki et al.
2012/0018404 A1   1/2012 Matsuo et al.
(Continued)

FOREIGN PATENT DOCUMENTS

EP   2 410 551 A2   1/2012
JP   31-14928 Y1    9/1956
(Continued)

OTHER PUBLICATIONS

WO-2005/041231; Abstract; 2005; Electrical contact opening/closing device and power consumption suppressing circuit; (Year: 2005).*

(Continued)

*Primary Examiner* — Dharti H Patel
(74) *Attorney, Agent, or Firm* — Wolf, Greenfield & Sacks, P.C.

(57) ABSTRACT

[Object] To provide a switching device in which it is possible to suppress an occurrence of an arc while preventing a contact welding of a switch.
[Solution] Provided is the switching device including: a first circuit breaker mechanism provided in a path of current output from a direct current power supply; a second circuit breaker mechanism that is provided in parallel with the first circuit breaker mechanism in the path of current output from the direct current power supply, and is connected and disconnected with a time lag from the first circuit breaker mechanism; a capacitor provided between the direct current power supply and the second circuit breaker mechanism; and a discharging unit that is connected in parallel with the capacitor. A disconnection speed when the first circuit breaker mechanism is disconnected and a capacitance of the capacitor are set such that a dielectric strength voltage rises faster than a rising speed of a charging voltage of the
(Continued)

capacitor, in a case where resistance of a load that receives a supply of the current from the direct current power supply is minimal.

16 Claims, 12 Drawing Sheets

(51) Int. Cl.
  *H01H 3/00*   (2006.01)
  *H01H 9/42*   (2006.01)
  *H03K 17/0814*   (2006.01)
  *H01H 13/64*   (2006.01)

(52) U.S. Cl.
  CPC .......... *H01H 9/542* (2013.01); *H01H 33/596* (2013.01); *H03K 17/0814* (2013.01); *H01H 13/64* (2013.01)

(58) Field of Classification Search
  USPC ............................................................ 361/2
  See application file for complete search history.

(56) References Cited

U.S. PATENT DOCUMENTS

2016/0285250 A1  9/2016 Lee et al.
2016/0322178 A1  11/2016 Park et al.

FOREIGN PATENT DOCUMENTS

| JP | 49-143731 U | 12/1974 |
| JP | 53-136644 A | 11/1978 |
| JP | 56-25424 U | 3/1981 |
| JP | 09-205771 A | 8/1997 |
| JP | 2007-213842 A | 8/2007 |
| WO | WO 2005/041231 A1 | 5/2005 |
| WO | WO 2015/053484 A1 | 4/2015 |
| WO | WO 2015/102311 A1 | 7/2015 |

OTHER PUBLICATIONS

EP-2410551, Specification, figures, abstract; Direct-current switch (Year: 2012).*
International Search Report and English translation thereof dated Jan. 12, 2016 in connection with International Application No. PCT/JP2015/079410.
Written Opinion and English translation thereof dated Jan. 12, 2016 in connection with International Application No. PCT/JP2015/079410.
International Preliminary Report on Patentability and English translation thereof dated Mar. 15, 2018 in connection with International Application No. PCT/JP2015/079410.
Extended European Search Report dated Apr. 17, 2019 in connection with European Application No. 15903077.4.

* cited by examiner

AMOUNT OF MOVEMENT OF 1a

SWITCHING DEVICE, MOVABLE BODY, POWER SUPPLY SYSTEM AND SWITCHING METHOD

CROSS REFERENCE TO RELATED APPLICATIONS

This application is a National Stage of International Application No. PCT/JP2015/079410, filed in the Japanese Patent Office as a Receiving Office on Oct. 19, 2015, which claims priority to Japanese Patent Application No. JP 2015-174495, filed in the Japanese Patent Office on Sep. 4, 2015, each of which is hereby incorporated by reference in its entirety.

TECHNICAL FIELD

The present disclosure relates to a switching device, a movable body, a power supply system and a switching method.

BACKGROUND ART

An RC snubber circuit in which a capacitor and a resistor connected in series extend between both ends of a switch is well known (see Patent Literature 1, for example). An RC snubber circuit has a simple configuration, and is able to absorb transient high voltage by appropriately selecting a circuit constant, and suppress an occurrence of an arc by lowering resistance.

CITATION LIST

Patent Literature

Patent Literature 1: JP H9-205771A

DISCLOSURE OF INVENTION

Technical Problem

However, when using a conventional RC snubber circuit to break direct current power, the current at the time a charge stored in the capacitor is discharged when the switch is turned on may become too large, and a contact of the switch may become welded.

Therefore, the present disclosure proposes a new and improved switching device, movable body, power supply system and switching method in which it is possible to suppress an occurrence of an arc while preventing a contact welding of a switch.

Solution to Problem

According to the present disclosure, there is provided a switching device including: a first circuit breaker mechanism provided in a path of current output from a direct current power supply; a second circuit breaker mechanism that is provided in parallel with the first circuit breaker mechanism in the path of current output from the direct current power supply, and is connected before the first circuit breaker mechanism when current output from the direct current power supply is supplied, and is disconnected after the first circuit breaker mechanism when current output from the direct current power supply is broken; a capacitor provided between the direct current power supply and the second circuit breaker mechanism; and a discharging unit that is connected in parallel with the capacitor and discharges a charge stored in the capacitor when current output from the direct current power supply is broken. A disconnection speed when the first circuit breaker mechanism is disconnected and a capacitance of the capacitor are set such that a dielectric strength voltage rises faster than a rising speed of a charging voltage of the capacitor, in a case where resistance of a load that receives a supply of the current from the direct current power supply is minimal.

In addition, according to the present disclosure, there is provided a switching device including: a first switch provided in a path of current output from a direct current power supply; a second switch that is provided in parallel with the first switch in the path of current output from the direct current power supply, and turns on after the first switch is turned on, and turns off after a predetermined period of time after the first switch is turned off; a capacitor that gets connected in parallel with the first switch when the second switch turns on after the first switch is turned on; and a discharging unit that discharges a charge stored in the capacitor, after the second switch is turned off. A disconnection speed when the first switch is disconnected from an on state and a capacitance of the capacitor are set such that a dielectric strength voltage rises faster than a rising speed of a charging voltage of the capacitor, in a case where resistance of a load that receives a supply of current from the direct current power supply is minimal.

In addition, according to the present disclosure, there is provided a movable body including the switching device.

In addition, according to the present disclosure, there is provided a power supply system including: a battery that supplies direct current power; a drive unit that is driven by direct current power supplied from the battery; and at least one of the switching devices provided between the battery and the drive unit.

In addition, according to the present disclosure, there is provided a switching method including: connecting a first circuit breaker mechanism provided in a path of current output from a direct current power supply after connecting a second circuit breaker mechanism provided in parallel with the first circuit breaker mechanism in the path of current output from the direct current power supply, when supplying current output from the direct current power supply; and disconnecting the second circuit breaker mechanism after disconnecting the first circuit breaker mechanism, when breaking current output from the direct current power supply. A disconnection speed when the first circuit breaker mechanism is disconnected and a capacitance of a capacitor provided between the direct current power supply and the second circuit breaker mechanism are set such that a dielectric strength voltage rises faster than a rising speed of a charging voltage of the capacitor, in a case where resistance of a load that receives a supply of current from the direct current power supply is minimal.

In addition, according to the present disclosure, there is provided a switching method including: after a first switch provided in a path of current output from a direct current power supply is turned on, turning on a second switch provided in parallel with the first switch in the path for current output from the direct current power supply, and connecting a capacitor in parallel with the first switch; turning off the second switch after a predetermined period of time after the first switch is turned off; and discharging a charge stored in the capacitor after the second switch is turned off. A disconnection speed when the first switch is disconnected from an on state and a capacitance of the capacitor are set such that a dielectric strength voltage rises faster than a rising speed of a charging voltage of the capacitor, in a case where resistance of a load that receives a supply of current from the direct current power supply is minimal.

Advantageous Effects of Invention

As described above, according to the present disclosure, there are provided a new and improved switching device, movable body, power supply system and switching method in which it is possible to suppress an occurrence of an arc while preventing a contact welding of a switch.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
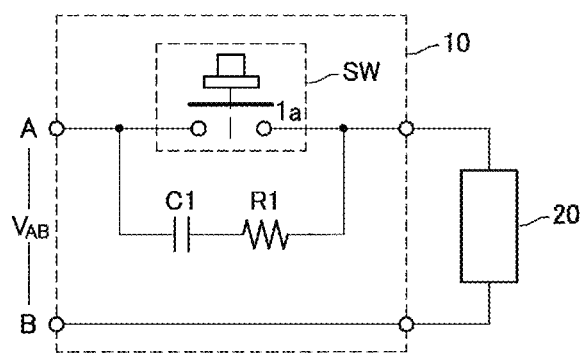
FIG. 1 is an explanatory view of a circuit configuration of a switching device 10 in which a typical RC snubber circuit is connected in parallel with a switch.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be given in the following order.

1. Embodiment of present disclosure
1.1. Background
1.2. Configuration examples
1.2.1. First configuration example
1.2.2. Second configuration example
1.2.3. Third configuration example
1.2.4. Fourth configuration example
1.2.5. Fifth configuration example
1.2.6. Sixth configuration example
1.2.7. Seventh configuration example
1.2.8. Eighth configuration example
1.2.9. Application example
2. Summary

1. EMBODIMENT OF PRESENT DISCLOSURE 1.1. Background

Before describing the embodiment of the present disclosure in detail, the background of the embodiment of the present disclosure will be described.

As described above, an RC snubber circuit in which a capacitor and a resistor connected in series extend between both ends of a switch is well known. An RC snubber circuit has a simple configuration, and is able to absorb transient high voltage by appropriately selecting a circuit constant, and suppress an occurrence of an arc by lowering resistance.

However, when using a conventional RC snubber circuit to break direct current power, the current at the time a charge stored in the capacitor is discharged when the switch is turned on may become too large, and a contact of the switch may become welded. Also, in the conventional RC snubber circuit, when a load is extremely small with respect to the capacitance of the capacitor, even if the switch is broken, power will continue to be supplied to the load until the charge in the capacitor has finished being discharged, so current is unable to be broken instantaneously. Also, in a conventional RC snubber circuit, if the resistance is made smaller and capacity of the capacitor is made larger, a change on the supply side of the direct current power will also be transmitted to the load, and power will be unable to be completely broken.

FIG. 1 is an explanatory view of a circuit configuration of a switching device 10 in which a typical RC snubber circuit is connected in parallel with a switch. The switching device 10 illustrated in FIG. 1 is a device that switches between supplying and breaking direct current power to a load 20 from a direct current power supply in which a potential difference between point A and point B is V. The switching device 10 has a configuration in which a switch SW is connected in parallel with an RC snubber circuit in which a capacitor C1 and a resistor R1 are connected in series.

Figure 2:
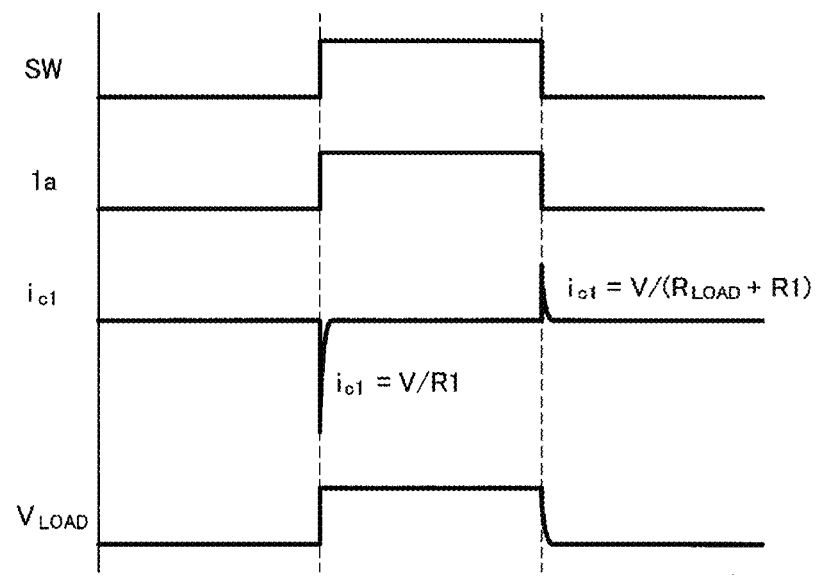
FIG. 2 is an explanatory view of an example of change in a state of the switching device 10 illustrated in FIG. 1, a current $i_{C1}$ that flows to a capacitor C1, and a voltage $V_{LOAD}$ applied to a load 20.

FIG. 2 is an explanatory view of an example of change in a state of the switching device 10 illustrated in FIG. 1, a current $i_{C_1}$ that flows to the capacitor C1, and a voltage $V_{LOAD}$ applied to the load 20.

When direct current power is supplied in a state in which the switch SW is broken, current according to resistance values of the resistor R1 and the load 20 flows to the capacitor C1. The capacitor C1 stores a charge according to the current that flows.

Here, when the switch SW is turned on, the charge stored in the capacitor C1 is discharged through a contact 1a of the switch SW. At this time, it is necessary to increase the resistance value of the resistor R1 so that the contact 1a of the switch SW will not become welded. This is because the current $i_{C_1}$ when the switch SW is turned on is obtained by dividing the voltage V of the direct current power by the resistance value of the resistor R1, as illustrated in FIG. 2. The amount of current that flows through the contact 1a of the switch SW can be made smaller by making the resistance value of the resistor R1 larger.

However, when the switch SW is disconnected, the resistance value of the resistor R1 must be made as small as possible. This is to ensure that bypass current that has flowed through the capacitor C1 flows sufficiently in order to make the inter-contact voltage of the contact 1a of the switch SW low enough to prevent dielectric breakdown. The current $i_{C_1}$ when the switch SW is disconnected is obtained by dividing the voltage V of the direct current power by a resistance value of the resistor R1 and a resistance value $R_{LOAD}$ of the load 20, as illustrated in FIG. 2.

In this way, with a typical RC snubber circuit, it is not possible to resolve a contradiction whereby the resistance value of the resistor R1 needs to be made larger when the switch SW is turned on, but the resistance value of the resistor R1 needs to be made as small as possible when the switch SW is disconnected.

Therefore, in view of the foregoing background, the inventor of the present disclosure has intensely studied technology capable of preventing both a contact welding when a switch that switches between supplying and breaking direct current power is turned on, and an occurrence of an arc when the switch is disconnected. As a result, the inventor of the present disclosure has devised technology capable of preventing both a contact welding when a switch that switches between supplying and breaking direct current power is turned on, and an occurrence of an arc when the switch is disconnected, as will be described below.

Heretofore, the background of the embodiment of the present disclosure has been described.

1.2. CONFIGURATION EXAMPLES

1.2.1. First Configuration Example

Next, an embodiment of the present disclosure will be described in detail. First, a first configuration example will be described.

Figure 3:
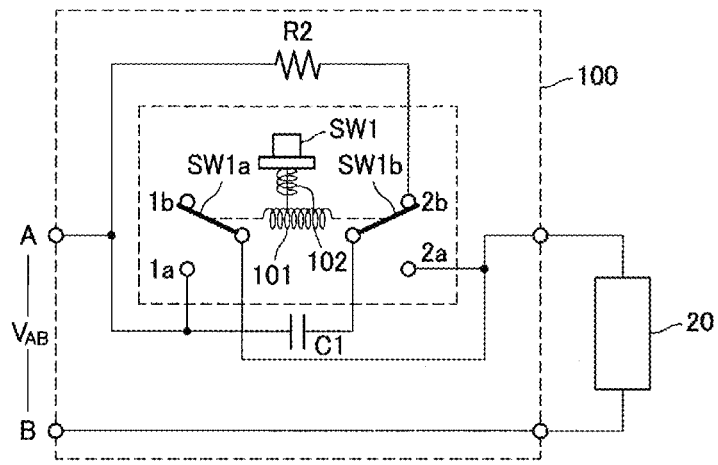
FIG. 3 is an explanatory view of a circuit configuration of a switching device 100.

FIG. 3 is an explanatory view of a circuit configuration of a switching device 100 according to an embodiment of the present disclosure. As illustrated in FIG. 3, the switching device 100 according to the embodiment of the present disclosure includes a switch SW1, a capacitor C1, and a resistor R2.

The switch SW1 is a push switch that switches the contacts of two transfer switches SW1a and SW1b. When the switch SW1 is depressed, the contacts of the two transfer switches SW1a and SW1b switch.

The switches SW1a and SW1b are connected by an elastic body such as a spring 101 so that contacts 2a and 2b switch after contacts 1a and 1b switch. The spring 101 that connects the switches SW1a and SW1b is connected to the switch SW1 via a spring 102 closer to the switch SW1a than the center so that the contacts 2a and 2b switch after the contacts 1a and 1b switch.

FIG. 4A to FIG. 4D are explanatory views illustrating operation of the transfer switches SW1a and SW1b by the depression and release of the depression of the switch SW1.

Figure 4A:
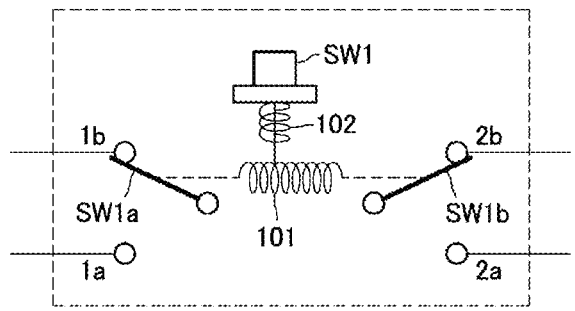
FIG. 4A is an explanatory view illustrating operation of transfer switches SW1a and SW1b by the depression and release of the depression of the switch SW1.

FIG. 4A illustrates a state in which the switch SW1 is not depressed. In the state in which the switch SW1 is not depressed, the switch SW1a is connected to the contact 1b, and the switch SW1b is connected to the contact 2b.

Figure 4B:
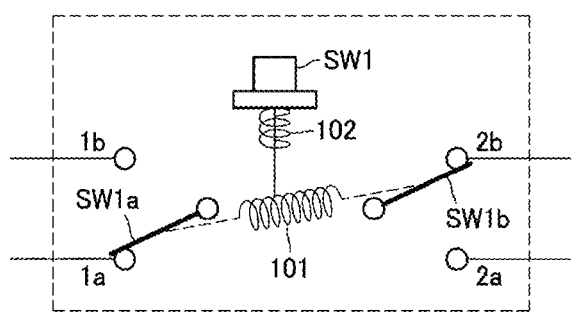
FIG. 4B is an explanatory view illustrating operation of transfer switches SW1a and SW1b by the depression and release of the depression of the switch SW1.

FIG. 4B illustrates a state in which the switch SW1 is half depressed. In the state in which the switch SW1 is half depressed, the connection of the switch SW1a switches at some point from the contact 1b to the contact 1a so the switch SW1a turns on. However, the spring 101 is connected to the switch SW1 via the spring 102 closer to the switch SW1a than the center, so the switch SW1b remains connected to the contact 2b at the time the connection of the switch SW1a switches to the contact 1a.

Figure 4C:
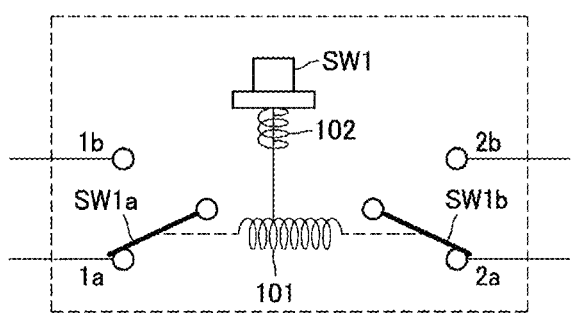
FIG. 4C is an explanatory view illustrating operation of transfer switches SW1a and SW1b by the depression and release of the depression of the switch SW1.

FIG. 4C illustrates a state in which the switch SW1 is completely depressed. In the state in which the switch SW1 is completely depressed, the switch SW1a is connected to the contact 1a, and the switch SW1b is connected to the contact 2a, so both switches turn on. Therefore, the switches SW1a and SW1b operate such that the connection switches from the contact 2b to the contact 2a after the connection switches from the contact 1b to the contact 1a.

Figure 4D:
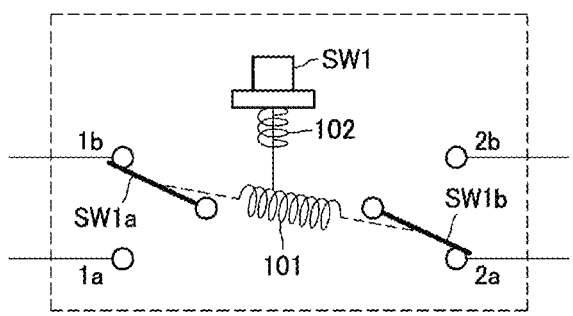
FIG. 4D is an explanatory view illustrating operation of transfer switches SW1a and SW1b by the depression and release of the depression of the switch SW1.

FIG. 4D illustrates a state in which depression of the switch SW1 is half released. In the state in which depression of the switch SW1 is half released, the connection of the switch SW1a switches at some point from the contact 1a to the contact 1b so the switch SW1a turns off. However, the spring 101 is connected to the switch SW1 via the spring 102 closer to the switch SW1a than the center, so the switch SW1b remains connected to the contact 2a at the time the connection of the switch SW1a switches to the contact 1b.

Then, when the depression of the switch SW1 is completely released, the switch SW1a becomes connected to the contact 1b, and the switch SW1b becomes connected to the contact 2b, as illustrated in FIG. 4A, so both switches turn off. Therefore, the switches SW1a and SW1b operate so as to switch from the contact 2a to the contact 2b after switching from the contact 1a to the contact 1b.

In this way, it is possible to prevent both a contact welding when a switch that switches between supplying and breaking direct current power is turned on, and an occurrence of an arc when the switch is disconnected, by the switches SW1a and SW1b switching.

Figure 5:
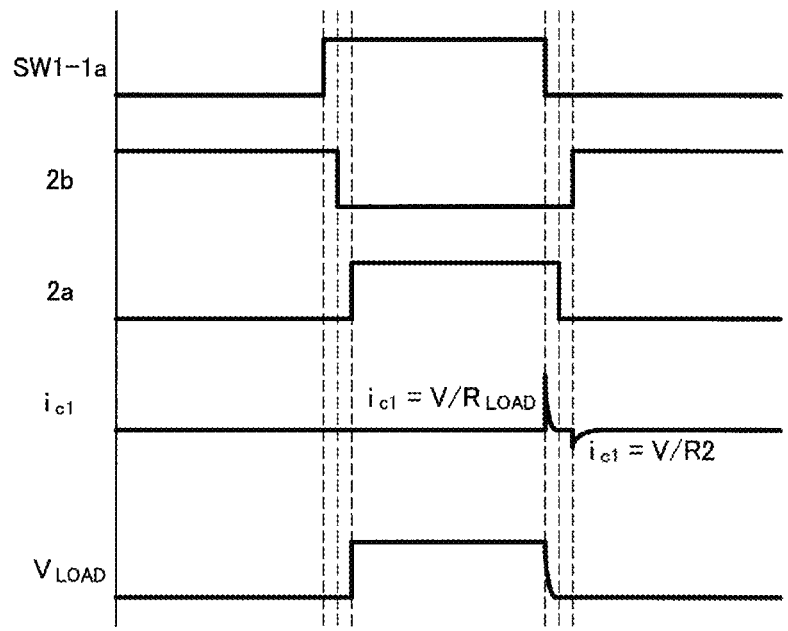
FIG. 5 is an explanatory view of an example of change in a state of the switching device 100 illustrated in FIG. 3, a current $i_{C1}$ that flows to a capacitor C1, and a voltage $V_{LOAD}$ applied to a load 20.

FIG. 5 is an explanatory view of an example of change in a state of the switching device 100 illustrated in FIG. 3, a current $i_{C_1}$ that flows to the capacitor C1, and a voltage $V_{LOAD}$ applied to the load 20.

In the state in which the switch SW1 is not depressed, the capacitor C1 is connected in series with the resistor R2, and a charge is not being stored.

When the connection of the switch SW1a switches to the contact 1a by the switch SW1 being depressed, voltage is applied to the load 20, and current from a direct current power supply flows to the load 20 through the switch SW1a. At the time the connection of the switch SW1a switches to the contact 1a, the switch SW1b remains connected to the contact 2b as described above. Then, as depression of the switch SW1 proceeds and the connection of the switch SW1b switches to the contact 2b, the capacitor C1 becomes connected in parallel with the switch SW1a.

When the depression of the switch SW1 is released and an circuit breaker operation begins, first the connection of the switch SW1a switches from the contact 1a to the contact 1b. When the connection of the switch SW1a switches from the contact 1a to the contact 1b, the capacitor C1 charges due to a potential difference between the contacts. Therefore, even if the connection of the switch SW1a switches from the contact 1a to the contact 1b, a rapid rise in voltage will not occur between the contacts of the switch SW1a, and thus dielectric breakdown will not occur, due to the charging being performed in the capacitor C1.

Then, when release of the depression of the switch SW1 proceeds, the connection of the switch SW1b switches from the contact 2a to the contact 2b after the connection of the switch SW1a switches from the contact 1a to the contact 1b. When the connection of the switch SW1b switches from the contact 2a to the contact 2b, the capacitor C1 becomes connected in series with the resistor R2, and the charge stored in the capacitor C1 is discharged through the resistor R2. Because the charge stored in the capacitor C1 is discharged through the resistor R2, the charge stored in the capacitor C1 will no longer flow through the switch SW1a when the switch SW1 is depressed again.

As described above, the switching device 100 illustrated in FIG. 3 is able to prevent both a contact welding of the switch SW1a when the switch SW1 that switches between supplying and breaking direct current power is depressed, and an occurrence of an arc at the switch SW1a when the depression of the switch SW1 is released, by the contact of the switch SW1b being switched after the contact of the switch SW1a is switched.

1.2.2. Second Configuration Example

Figure 6:
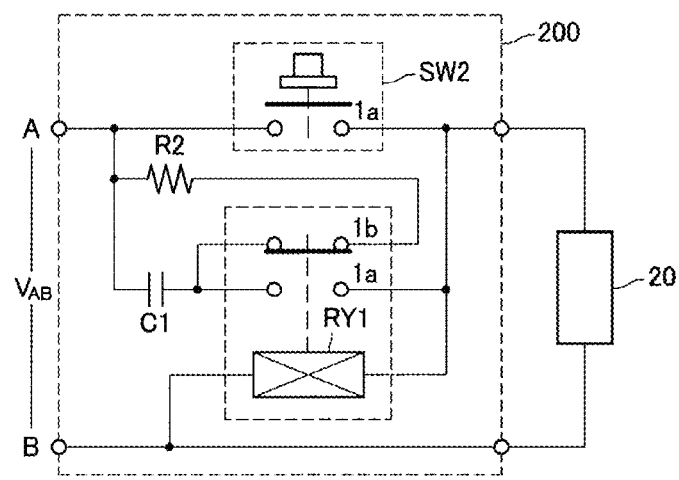
FIG. 6 is an explanatory view of a circuit configuration of a switching device 200.

Next, a second configuration example will be described.
FIG. 6 is an explanatory view of a circuit configuration of a switching device 200 according to an embodiment of the present disclosure. As illustrated in FIG. 6, the switching device 200 according to the embodiment of the present disclosure includes a switch SW2, a mechanical relay RY1, a capacitor C1, and a resistor R2.

The switch SW2 is a push-button switch having a contact 1a. When the switch SW2 is turned on by being depressed, current flows from a direct current power supply to a load 20 and the mechanical relay RY1 through the contact 1a. On the other hand, when the switch SW2 is turned off by the depression of the switch SW2 being released, current stops flowing to the load 20 and the mechanical relay RY1 through the contact 1a.

The mechanical relay RY1 has a coil inside. The mechanical relay RY1 turns off by connecting to a contact 1b in a state in which current is not flowing, and turns on by connecting to the contact 1a when current flows and magnetic force consequently acts on the internal coil. When the mechanical relay RY1 turns on, the capacitor C1 becomes connected in parallel with the switch SW2, and when the mechanical relay RY1 turns off, the capacitor C1 becomes connected in series with the resistor R2.

That is, the switching device 200 illustrated in FIG. 6 operates such that the mechanical relay RY1 turns on after the switch SW2 turns on, and the mechanical relay RY1 turns off after the switch SW2 turns off.

Figure 7:
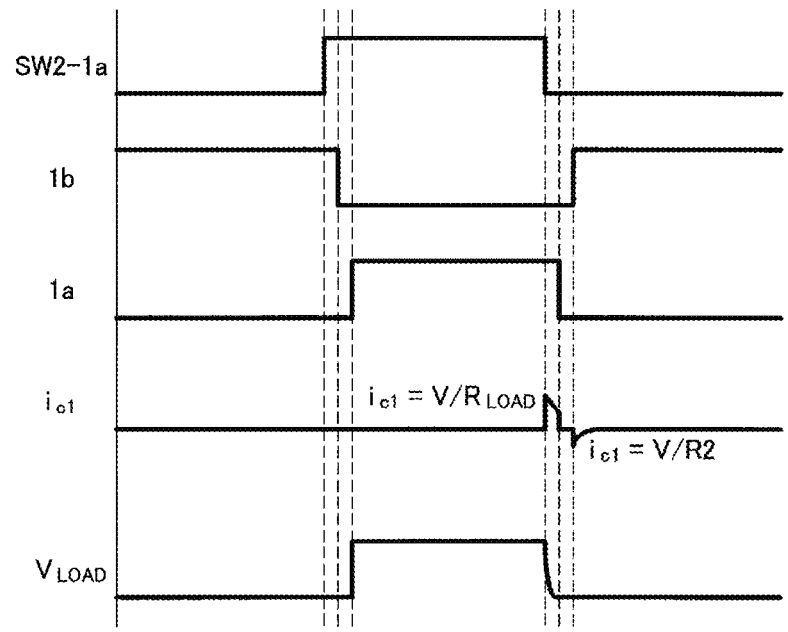
FIG. 7 is an explanatory view of an example of change in a state of the switching device 200 illustrated in FIG. 6, a current $i_{C1}$ that flows to a capacitor C1, and a voltage $V_{LOAD}$ applied to a load 20.

FIG. 7 is an explanatory view of an example of change in a state of the switching device 200 illustrated in FIG. 6, a current $i_{C_1}$ that flows to the capacitor C1, and a voltage $V_{LOAD}$ applied to the load 20.

In the state in which the switch SW2 is not depressed, the capacitor C1 is connected in series with the resistor R2, and a charge is not being stored.

When the switch SW2 is depressed, voltage is applied to the load 20, and current from the direct current power supply flows to the load 20 through the switch SW2. At this time, a charge is not being stored in the capacitor C1, so the contact 1a of the switch SW2 will not become welded by overcurrent due to the discharge of a charge stored in the capacitor C1.

When the switch SW2 is depressed and current flows to the mechanical relay RY1, the mechanical relay RY1 connects with the contact 1a by magnetic force generated by the internal coil and turns on.

When the depression of the switch SW1 is released and an circuit breaker operation begins, the capacitor C1 charges due to a potential difference between the contacts. Therefore, even if the depression of the switch SW1 is released, a rapid rise in voltage will not occur between both ends of the switch SW1, and thus dielectric breakdown will not occur, due to charging being performed in the capacitor C1.

Then, current will no longer flow to the mechanical relay RY1, so the magnetic force generated by the internal coil will be lost, and the connection will switch from the contact 1a to the contact 1b, so the mechanical relay RY1 will turn off. When the mechanical relay RY1 turns off, the capacitor C1 becomes connected in series with the resistor R2, and the charge stored in the capacitor C1 is discharged through the resistor R2. Because the charge stored in the capacitor C1 is discharged through the resistor R2, the charge stored in the capacitor C1 will no longer flow through the switch SW1 when the switch SW1 is depressed again.

The constant of the capacitor C1 is preferably a value in which a voltage rise curve that charges the capacitor C1 with the resistor R2 having the lowest resistance value rises more slowly than a dielectric breakdown curve calculated from the disconnection speed of the contact 1a of the switch SW2.

As described above, the switching device 200 illustrated in FIG. 6 is able to prevent both welding of the contact of the switch SW2 when the switch SW2 that switches between supplying and breaking direct current power is depressed, and an occurrence of an arc when the depression of the switch SW2 is released, by the contact of the mechanical relay RY1 being switched after the contact of the switch SW2 is switched.

1.2.3. Third Configuration Example

Next, a third configuration example will be described.

Figure 8:
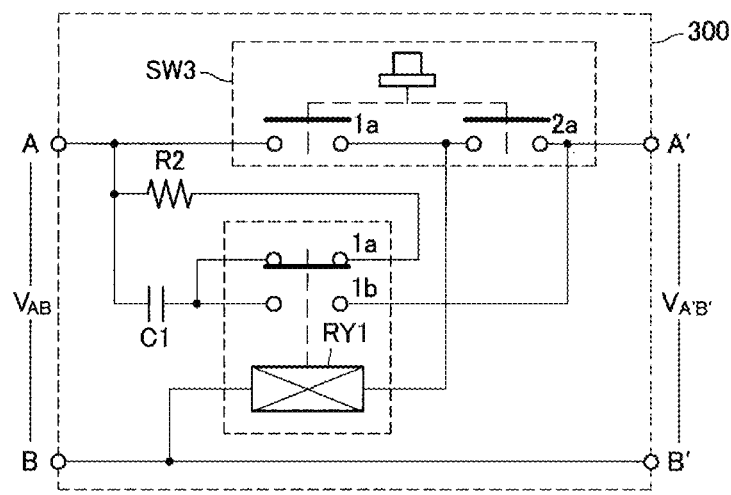
FIG. 8 is an explanatory view of a circuit configuration of a switching device 300.

FIG. 8 is an explanatory view of a circuit configuration of a switching device 300 according to an embodiment of the present disclosure. As illustrated in FIG. 8, the switching device 300 according to an embodiment of the present disclosure includes a switch SW3, a mechanical relay RY1, a capacitor C1, and a resistor R2.

The switching device 100 of the first configuration example and the switching device 200 of the second configuration example both switch between supplying and breaking current when current flows from a direct current power supply to the load 20. The switching device 300 of the third configuration example switches between supplying and breaking current when current is able to be supplied from both directions.

A switch SW3 is a push-button switch having a contact 1a and a contact 2a in series. When the switch SW3 is depressed and turns on, current flows from a direct current power supply to a terminal A' through the contacts 1a and 2a, and flows to the mechanical relay RY1 through the contact 1a. On the other hand, when the depression of the switch SW3 is released and the switch SW3 turns off, current stops flowing to the terminal A' and the mechanical relay RY1 through the contacts 1a and 2a.

The mechanical relay RY1 has a coil inside. The mechanical relay RY1 connects to a contact 1b and thus turns off in a state in which current is not flowing, and connects to the contact 1a and thus turns on when current flows and magnetic force consequently acts on the internal coil. When the mechanical relay RY1 turns on, the capacitor C1 becomes connected in parallel with the switch SW2, and when the mechanical relay RY1 turns off, the capacitor C1 becomes connected in series with the resistor R2.

That is, the switching device 300 illustrated in FIG. 8 operates such that the mechanical relay RY1 turns on after the switch SW3 turns on, and the mechanical relay RY1 turns off after the switch SW3 turns off.

Also, the switching device 300 illustrated in FIG. 8 is configured to supply current to the mechanical relay RY1 from between the contacts 1a and 2a connected in series. Because the switching device 300 is configured to supply current to the mechanical relay RY1 from between the contacts 1a and 2a connected in series, the switching device 300 prevents the mechanical relay RY1 from operating irrespective of the state of the switch SW3, when current is supplied from the terminal A' side.

As described above, the switching device 300 illustrated in FIG. 8 is able to prevent both a contact welding of the switch SW3 when the switch SW3 that switches between supplying and breaking direct current power is depressed, and an occurrence of an arc when the depression of the switch SW2 is released, by the contact of the mechanical relay RY1 being switched after the contact of the switch SW3 is switched.

1.2.4. Fourth Configuration Example

Next, a fourth configuration example will be described.

Figure 9:
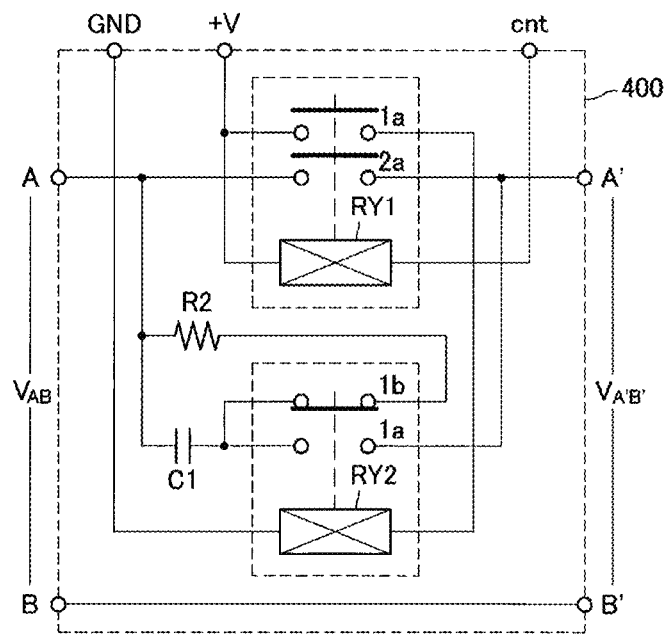
FIG. 9 is an explanatory view of a circuit configuration of a switching device 400.

FIG. 9 is an explanatory view of a circuit configuration of a switching device 400 according to an embodiment of the present disclosure. As illustrated in FIG. 9, the switching device 400 according to the embodiment of the present disclosure includes mechanical relays RY1 and RY2, a capacitor C1, and a resistor R2.

The mechanical relay RY1 has a coil inside. The mechanical relay RY1 turns off in a state in which no current is flowing through a terminal +V from an external power supply, and connects with contacts 1a and 2a and turns on when current flows and magnetic force consequently acts on the internal coil. When the mechanical relay RY1 turns on, current flows from a direct current power supply to a terminal A' through the contact 2a, and current flows from the external power supply to the mechanical relay RY2 through the contact 1a. On the other hand, when the mechanical relay RY1 turns off, current stops flowing to the terminal A' through the contact 2a, and current stops flowing to the mechanical relay RY2 from the external power supply.

The mechanical relay RY2 has a coil inside. The mechanical relay RY2 connects with the contact 1b and turns off in a state in which current is not flowing through the terminal +V and the contact 1a of the mechanical relay RY1 from the external power supply, and connects with the contact 1a and turns on when current flows through the terminal +V and the contact 1a of the mechanical relay RY1 from the external power supply and magnetic force consequently acts on the internal coil. When the mechanical relay RY2 turns on, the capacitor C1 becomes connected in parallel with the mechanical relay RY1, and when the mechanical relay RY2 turns off, the capacitor C1 becomes connected in series with the resistor R2.

That is, the switching device 400 illustrated in FIG. 9 operates such that the mechanical relay RY2 turns on after the mechanical relay RY1 turns on, and the mechanical relay RY2 turns off after the mechanical relay RY1 turns off.

Also, the switching device 400 illustrated in FIG. 9 is configured to supply current to the mechanical relay RY2 from an external power supply. Because the switching device 400 is configured to supply current to the mechanical relay RY2 from the external power supply, the switching device 400 prevents the mechanical relay RY2 from operating irrespective of the state of the mechanical relay RY1, when current is supplied from the terminal A' side.

As described above, the switching device 400 illustrated in FIG. 9 is able to prevent both a contact welding of the mechanical relay RY1 when the mechanical relay RY1 that switches between supplying and breaking direct current power operates, and an occurrence of an arc, by the contact of the mechanical relay RY2 being switched after the contact of the mechanical relay RY1 is switched.

1.2.5. Fifth Configuration Example

Next, a fifth configuration example will be described.

Figure 10A:
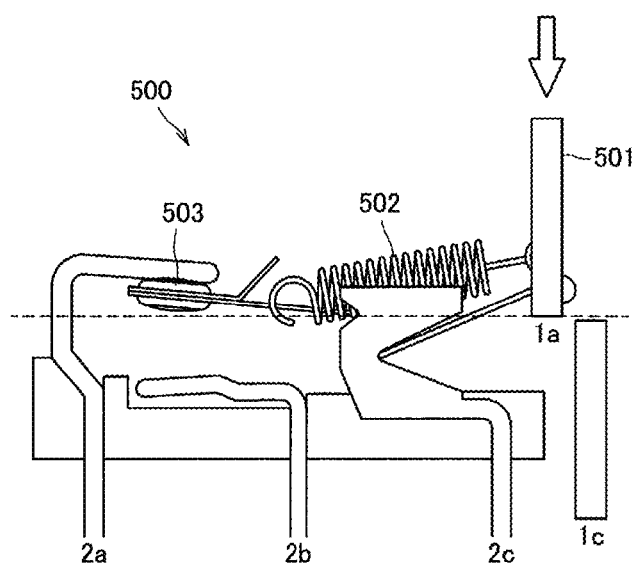
FIG. 10A is an explanatory view of a configuration of a switching device 500.
Figure 10B:
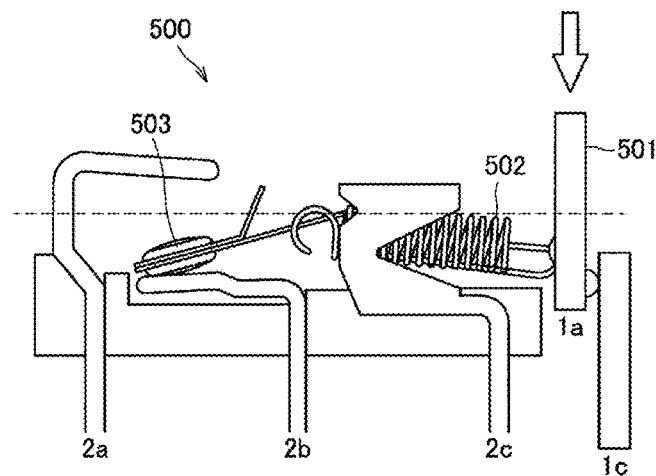
FIG. 10B is an explanatory view of the configuration of the switching device 500.

FIG. 10A and FIG. 10B are explanatory views of the configuration of a switching device 500 according to an embodiment of the present disclosure. The switching device 500 illustrated in FIG. 10A and FIG. 10B is configured such that the state of a micro switch 503 switches after the state of a slide switch 501 switches, similar to each of the configuration examples described above.

At the time when the slide switch 501 moves downward in FIG. 10A and a contact 1a contacts a contact 1c and turns on, the micro switch 503 remains connected to the contact 2b and thus off. Then, when the slide switch 501 moves further downward, the micro switch 503 connects with the contact 2a and thus switches on, by the elastic force of a spring 502, as illustrated in FIG. 10B.

The opposite direction is similar. At the time when the slide switch 501 moves upward in FIG. 10A and the contact 1a comes out of contact with the contact 1c and turns off, the micro switch 503 remains connected to the contact 2a and thus on. Then, when the slide switch 501 moves further upward, the micro switch 503 connects with the contact 2b and thus switches off, by the elastic force of the spring 502.

Figure 11:
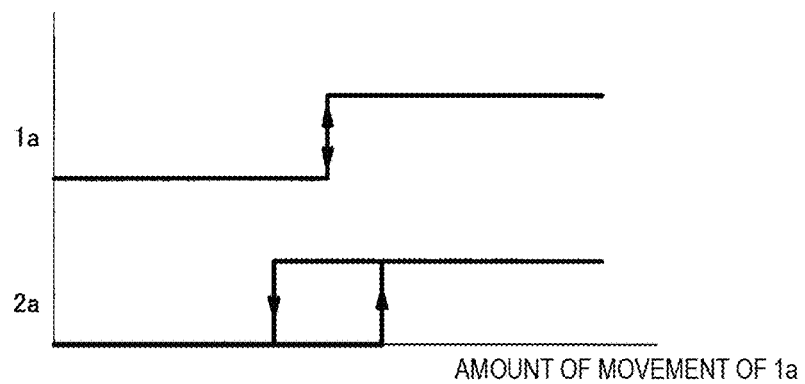
FIG. 11 is an explanatory view illustrating operation of the switching device 500.

FIG. 11 is an explanatory view illustrating the operation of the switching device 500. The horizontal axis of the graph illustrated in FIG. 11 represents the amount of movement of the contact 1a of the slide switch 501, and indicates that the contact 1a of the slide switch 501 moves downward in FIG. 10A farther toward the right in the graph. Also, the vertical axis of the graph illustrated in FIG. 11 represents on and off states of the contact 1a of the slide switch 501 and on and off states of the micro switch 503.

As illustrated in FIG. 11, with the slide switch 501, the on state and the off state switch with each other at a fixed point, but with the micro switch 503, hysteresis is provided in the switching of the on state and the off state.

1.2.6. Sixth Configuration Example

Next, a sixth configuration example will be described.

FIG. 12A to FIG. 12F are explanatory views of the configuration of a switching device 600 according to an embodiment of the present disclosure. The switching device 600 has a structure in which two slide switches 601 and 611 are used in combination.

Figure 12A:
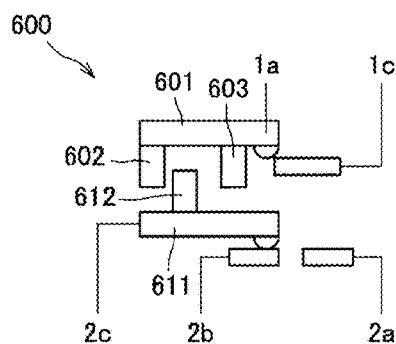
FIG. 12A is an explanatory view of a configuration of a switching device 600.

FIG. 12A illustrates a state in which both of the slide switches 601 and 611 are off. When the slide switch 601 is off, it means that the contact 1a is not contacting the contact 1c. When the slide switch 611 is off, it means that the contact 2c is not contacting the contact 2a.

The slide switch 601 has engaging portions 602 and 603 that are formed protruding. The slide switch 611 has an engaging portion 612 that is formed protruding.

Figure 12B:
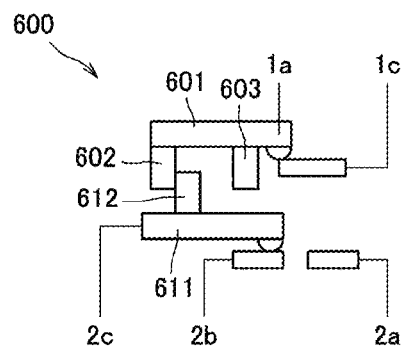
FIG. 12B is an explanatory view of the configuration of the switching device 600.

FIG. 12B illustrates the switching device 600 in a state in which the contact 1a is contacting the contact 1c as a result of the slide switch 601 moving to the right from the state illustrated in FIG. 12A. The slide switch 601 moves to the right together with the slide switch 611, by the engaging portion 602 engaging with the engaging portion 612.

Figure 12C:
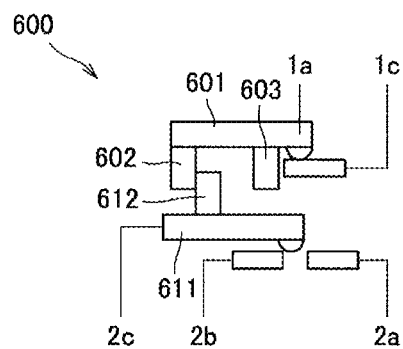
FIG. 12C is an explanatory view of the configuration of the switching device 600.

FIG. 12C illustrates the switching device 600 in a state in which the contact 1a is contacting the contact 1c, and the contact 2c is positioned between the contact 2a and the contact 2b, as a result of the slide switch 601 moving further to the right from the state illustrated in FIG. 12B.

Figure 12D:
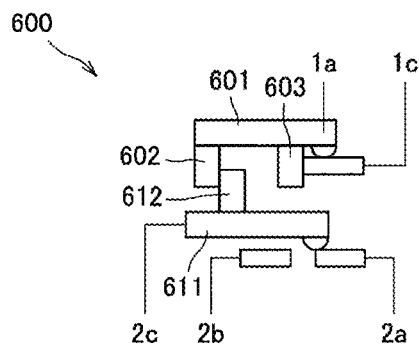
FIG. 12D is an explanatory view of the configuration of the switching device 600.

FIG. 12D illustrates the switching device 600 in a state in which the contact 1a is contacting the contact 1c, and the contact 2c is contacting the contact 2a, as a result of the slide switch 601 moving further to the right from the state illustrated in FIG. 12C.

The switching device 600 is able to make the contact 2c contact the contact 2a after making the contact 1a contact the contact 1c, by having the slide switches 601 and 611 slide in this way.

Figure 12E:
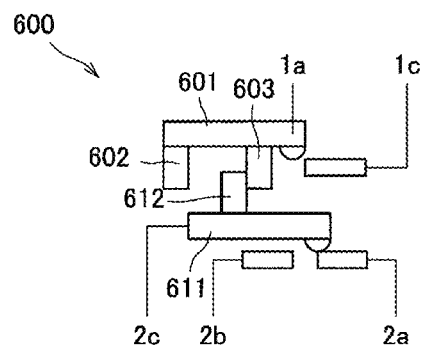
FIG. 12E is an explanatory view of the configuration of the switching device 600.

FIG. 12E illustrates the switching device 600 in a state in which the contact 1a is disconnected from the contact 1c as a result of the slide switch 601 moving to the left from the state illustrated in FIG. 12D, but the contact 2c is still contacting the contact 2a. When the slide switch 601 of the switching device 600 is moved to the left from the state illustrated in FIG. 12D, only the slide switch 601 moves to the left because of the space between the engaging portions 602 and 603.

Figure 12F:
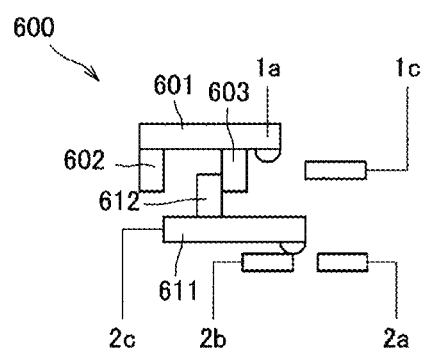
FIG. 12F is an explanatory view of the configuration of the switching device 600.

FIG. 12F illustrates the switching device 600 in a state in which the contact 1a is kept disconnected from the contact 1c, and the contact 2c is contacting the contact 2b, as a result of the slide switch 601 moving to the left from the state illustrated in FIG. 12E. The slide switch 601 moves to the left together with the slide switch 611, by the engaging portion 603 engaging with the engaging portion 612.

The switching device 600 is able to make the contact 2c come out of contact with the contact 2a after making the contact 1a come out of contact with the contact 1c, by having the slide switches 601 and 611 slide in this way.

The switching device 600 illustrated in FIG. 12A to FIG. 12F is able to prevent both a contact welding and an occurrence of an arc, by providing a time lag in the switching between on and off of the two contacts.

1.2.7. Seventh Configuration Example

Next, a seventh configuration example will be described.

The seventh configuration example prevents both a contact welding and an occurrence of an arc, by providing a time lag in the switching between on and off of the two contacts, similar to each of the configuration examples described above.

Figure 13:
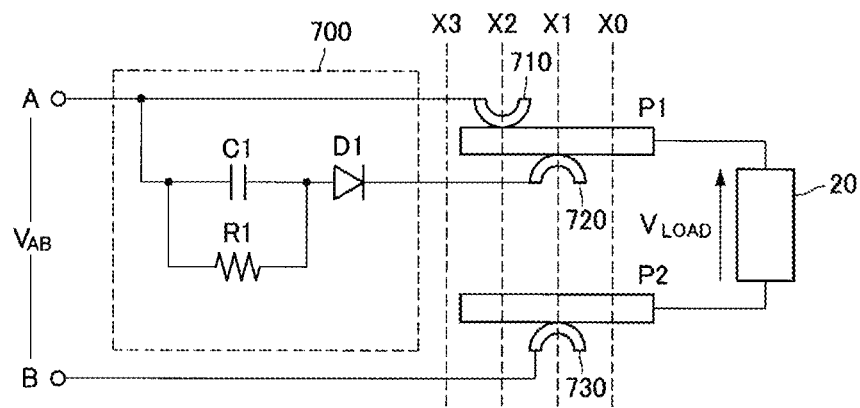
FIG. 13 is an explanatory view of a circuit configuration of a switching device 700.

FIG. 13 is an explanatory view of a circuit configuration of a switching device 700 according to an embodiment of the present disclosure. The switching device 700 illustrated in FIG. 13 is a device that switches between supplying and breaking current from a direct current power supply to a load 20 provided with plug electrodes P1 and P2. As illustrated in FIG. 13, the switching device 700 includes a capacitor C1 and a diode D1 that are provided in series with a main terminal 720, and a resistor R1 that is provided in parallel with the capacitor C1.

The plug electrode P1 contacts the main terminal 720 and an auxiliary terminal 710, and the plug electrode P2 contacts a main terminal 730. The positions of the main terminals 720 and 730 are determined such that the plug electrodes P1 and P2 are able to be connected with and disconnected from the main terminals 720 and 730 simultaneously. Also, the position of the auxiliary terminal 710 is determined to be on the far side of the main terminal 720 in the direction in which the plug electrode P1 is inserted.

In FIG. 13, the positions of the plug electrodes P1 and P2 are indicated by X0 to X3. The position X0 indicates a position in which the plug electrodes P1 and P2 are not contacting the main terminals 720 and 730, the position X1 indicates a position in which the plug electrodes P1 and P2 are contacting the main terminals 720 and 730, but the plug electrode P1 is not contacting the auxiliary terminal 710, the position X2 indicates a position in which the plug electrodes P1 and P2 are contacting the main terminals 720 and 730, and the plug electrode P1 is contacting the auxiliary terminal 710, and the position X3 indicates a position in which the plug electrodes P1 and P2 are fully inserted.

When the plug electrode P1 is inserted toward the main terminal 720, the plug electrode P1 connects to the main terminal 720 at X1, and is then connected to the auxiliary terminal 710 at X2. When the plug electrode P1 is removed, the plug electrode P1 is disconnected from the auxiliary terminal 710 at X2, and then the plug electrode P1 is disconnected from the main terminal 720 at X1.

Figure 14:
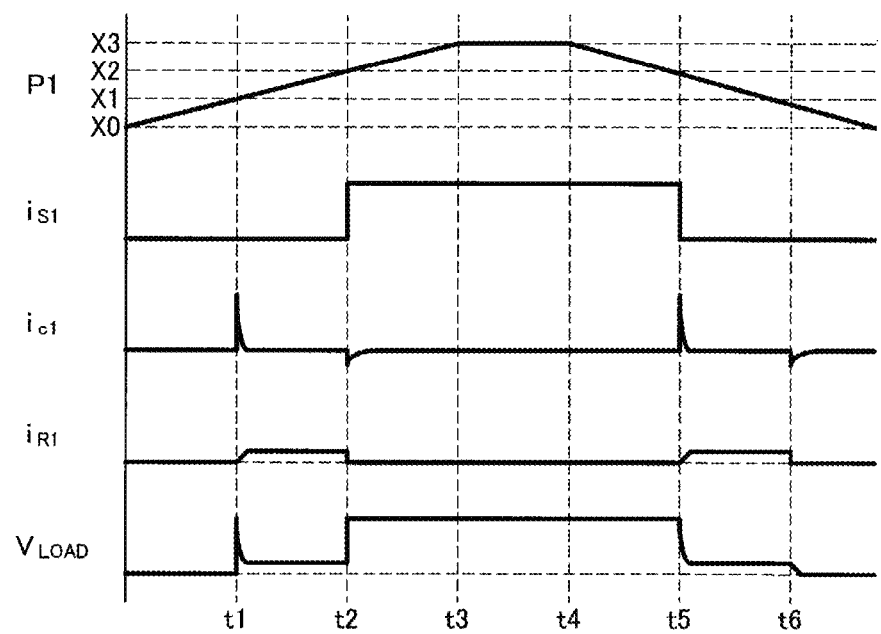
FIG. 14 is an explanatory view of an example of change in a position of a plug electrode P1, a current $i_{S1}$ that flows to an auxiliary terminal 710, a current $i_{C1}$ that flows to a capacitor C1, a current $i_{S1}$ that flows to a resistor R1, and a voltage $V_{LOAD}$ applied to a load 20.

FIG. 14 is an explanatory view of an example of change in a position of the plug electrode P1 illustrated in FIG. 13, a current $i_{S1}$ that flows to the auxiliary terminal 710, a current $i_{C1}$ that flows to the capacitor C1, a current $i_{S1}$ that flows to the resistor R1, and a voltage $V_{LOAD}$ applied to the load 20.

First, an insertion sequence of the plug electrode P1 will be described. While the position of the plug electrode P1 is between X0 and X1, that is, before the plug electrode P1 contacts the main terminal 720, the values of the current $1_{S1}$, the current $i_{C1}$, the current $i_{S1}$, and the voltage $V_{LOAD}$ are naturally all 0.

Then, when the position of the plug electrode P1 reaches X1 at time t1, that is, when the plug electrode P1 contacts the main terminal 720, momentary current flows to the capacitor C1 and the voltage $V_{LOAD}$ also momentarily rises. However, the plug electrode P1 is not contacting the auxiliary terminal 710, so the current $i_S$ remains at 0.

Then, when the position of the plug electrode P1 reaches X2 at time t2, that is, when the plug electrode P1 contacts not only the main terminal 720 but also the auxiliary terminal 710, current from the direct current power supply flows to the plug electrode P1 through the auxiliary terminal 710. That is, the current $i_S$ rises.

At the time of time t2, the auxiliary terminal 710 and the main terminal 720 are short-circuited via the plug electrode P1. However, because the diode D1 is provided, the charge stored in the capacitor C1 due to momentary current flowing to the capacitor C1 at the time of time t1 is gradually discharged via the resistor R1. Therefore, the auxiliary terminal 710 and the main terminal 720 will not become welded to the plug electrode P1 due to discharge current from the capacitor C1.

Then, the position of the plug electrode P1 reaches X3 at time t3, that is, the plug electrode P1 is fully inserted.

Next, the removal sequence of the plug electrode P1 will be described. At time t4, the position of the plug electrode P1 is X3, that is, the plug electrode P1 is fully inserted. The removal sequence of the plug electrode P1 will be described assuming that removal of the plug electrode P1 starts at time t4.

Then, when the position of the plug electrode P1 reaches X2 at time t5, that is, when the plug electrode P1 comes out of contact with the auxiliary terminal 710, current from the direct current power supply stops flowing to the plug electrode P1 through the auxiliary terminal 710. That is, the current $i_S$ drops all at once to 0.

When the plug electrode P1 comes out of contact with the auxiliary terminal 710, momentary current flows to the capacitor C1 due to the potential difference between the auxiliary terminal 710 and the plug electrode P1. The potential difference between the auxiliary terminal 710 and the plug electrode P1 is absorbed by the capacitor C1, so even if the plug electrode P1 comes out of contact with the auxiliary terminal 710, dielectric breakdown will not occur between the auxiliary terminal 710 and the plug electrode P1.

Then, when the position of the plug electrode P1 reaches X1 at time t6, that is, when the plug electrode P1 comes out of contact with the main terminal 720, the charge stored in the capacitor C1 is discharged through the resistor R1. Even if the plug electrode P1 comes out of contact with the main terminal 720, the current from the capacitor C1 is reduced by the resistor R1. Therefore, even if the plug electrode P1 comes out of contact with the main terminal 720, an arc will not occur.

The switching device 700 illustrated in FIG. 13 is able to prevent both the main terminal 720 and the auxiliary terminal 710 from becoming welded to the plug electrode P1 when the plug electrode P1 is inserted, and an arc from occurring when the plug electrode P1 is removed, by having the plug electrode P1 contact the main terminal 720 and the auxiliary terminal 710 in this order in the insertion sequence of the plug electrode P1, and having the plug electrode P1 disconnect from the auxiliary terminal 710 and the main terminal 720 in this order in the removal sequence of the plug electrode P1.

1.2.8. Eighth Configuration Example

Next, an eighth configuration example will be described.

The eighth configuration example prevents both a contact welding and an occurrence of an arc, by providing a time lag in the switching between on and off of two contacts, similar to each of the configuration examples described above.

Figure 15:
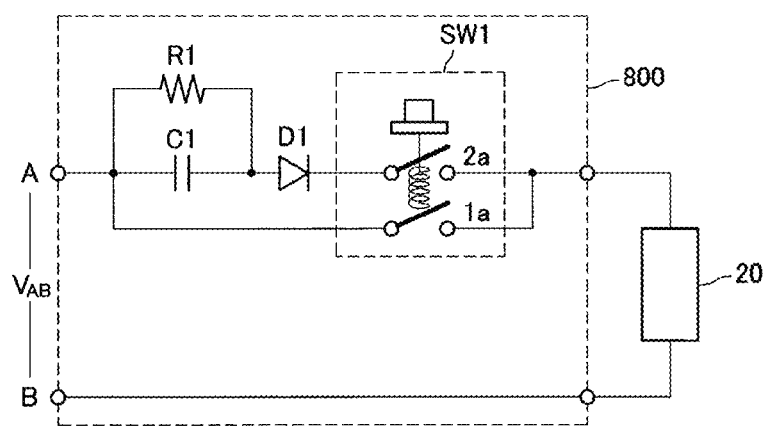
FIG. 15 is an explanatory view of a circuit configuration of a switching device 800.

FIG. 15 is an explanatory view of a circuit configuration of a switching device 800 according to an embodiment of the present disclosure. The switching device 800 illustrated in FIG. 15 is a device that switches between supplying and breaking current from a direct current power supply to a load 20. As illustrated in FIG. 15, the switching device 800 includes a two-circuit switch SW1 having two contacts 1a and 2a, a capacitor C1 and a diode D1 that are provided in series with the contact 2a of the switch SW1, and a resistor R1 that is provided in parallel with the capacitor C1.

The switch SW1 is configured such that the contacts 2a and 1a turn on in this order when the switch SW1 is turned on, and the contacts 1a and 2a turn off in this order when the switch SW1 is broken. The contacts 1a and 2a are connected by an elastic body such as a spring, for example.

Figure 16:
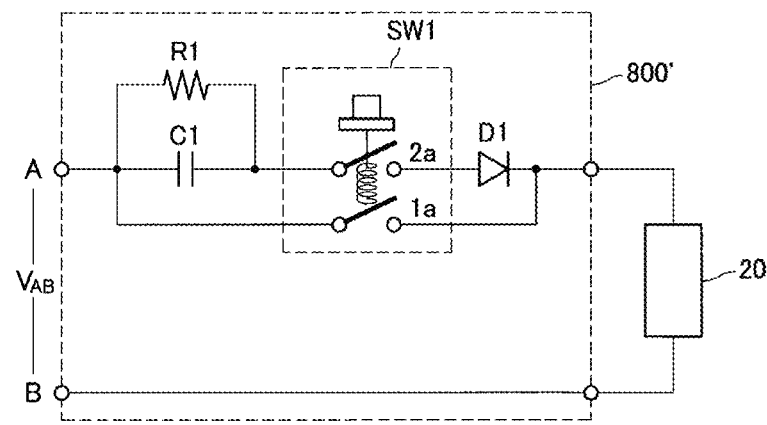
FIG. 16 is an explanatory view of an example of change in a position of a switch SW1, states of contacts 1a and 2a, a current $i_1a$ that flows to the contact 1a, a current $i_2a$ that flows to the contact 2a, and a voltage $V_{LOAD}$ applied to a load 20.

FIG. 16 is an explanatory view of an example of change in a position of the switch SW1 of the switching device 800 and states of contacts 1a and 2a, a current $i_{1a}$ that flows to the contact 1a, a current $i_{2a}$ that flows to the contact 2a, and a voltage $V_{LOAD}$ applied to a load 20.

First, a sequence of turning on the switch SW1 will be described. In a state in which the switch SW1 is not turned on (the position of the switch SW1 in this state is P0), the values of the current $i_{1a}$, the current $i_{2a}$, and the voltage $V_{LOAD}$ are naturally all 0.

When the switch SW1 starts to be turned on and the contact 2a turns on first at time t1 (the position of the switch SW1 in this state is P1), momentary current flows to the capacitor C1 and the voltage $V_{LOAD}$ also momentarily rises. That is, the current $i_{2a}$ momentarily rises. However, the contact 1a remains off, so the current $i_{1a}$ remains at 0. A combined current of the current that flows through the capacitor C1 and the current that flows through the resistor R1 flows to the load 20.

Then, when the contact 1a also turns on at time t2 (the position of the switch SW1 in this state is P2), current from the direct current power supply flows to the load 20 through the contact 1a. That is, the current $i_{1a}$ rises.

Because the diode D1 is provided, the charge stored in the capacitor C1 due to the momentary current flowing to the capacitor C1 at the time of time t1 is gradually discharged via the resistor R1 and the contact 1a. Therefore, the contacts 1a and 2a will not become welded by the discharge current from the capacitor C1.

Then, the switch SW1 turns completely on at time t3 (the position of the switch SW1 in this state is P3).

Next, an circuit breaker sequence of the switch SW1 will be described. At time t4, the position of the switch SW1 is P3. The sequence of disconnecting the switch SW1 will be described assuming that the sequence of disconnecting the switch SW1 starts at time t4.

Then, when the position of the switch SW1 reaches P2 at time t5, that is, when the contact 1a turns off, current from the direct current power supply stops flowing to the load 20. That is, the current $i_{1a}$ drops all at once to 0.

When the contact 1a turns off, momentary current flows to the capacitor C1 due to the potential difference between both ends of the contact 1a. Because the potential difference between both ends of the contact 1a is absorbed by the capacitor C1, dielectric breakdown will not occur in the contact 1a, even if the contact 1a is turned off.

Then, when the position of the switch SW1 reaches P1 at time t6, that is, when the contact 2a turns off, the charge stored in the capacitor C1 is discharged through the resistor R1. Current from the capacitor C1 is reduced by the resistor R1, even when the contact 2a is off. Therefore, an arc will not occur even when the contact 2a is off.

The switching device 800 illustrated in FIG. 15 is able to prevent both a contact welding when the switch SW1 is turned on and an occurrence of an arc when the switch SW1 is broken, by having the contacts 2a and 1a turn on in this order in the sequence of turning on the switch SW1, and having the contacts 1a and 2a turn off in this order in the sequence of disconnecting the switch SW1.

Figure 17:
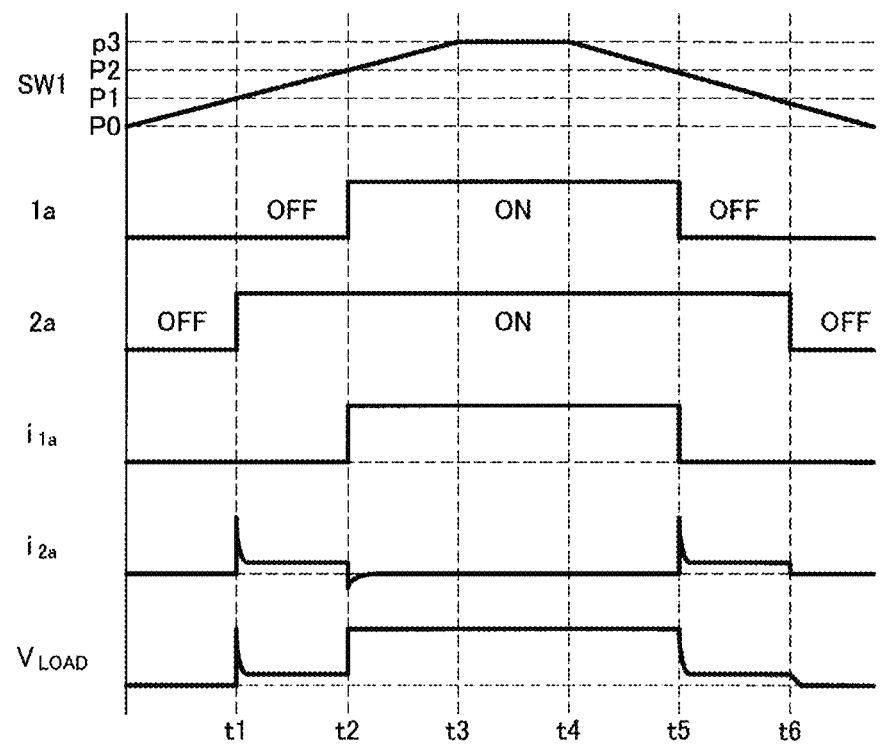
FIG. 17 is an explanatory view of a circuit configuration of a switching device 800'.

Note that the switching device 800 illustrated in FIG. 15 is such that the position of the diode D1 is between the capacitor C1 and the switch SW1, but the present disclosure is not limited to this example. FIG. 17 is an explanatory view of a circuit configuration of a switching device 800' according to an embodiment of the present disclosure. As illustrated in FIG. 17, the diode D1 may also be provided on the side of the load 20 of the switch SW1.

Regarding the capacitor C1 used in the switching device of each of the configuration examples described above, it is preferable to select a capacitor that has a capacitance that will not cause dielectric breakdown when a contact is disconnected. Hereinafter, the condition of the capacitance required for the capacitor C1 used in the switching device of each of the configuration examples described above will be described.

Figure 18:
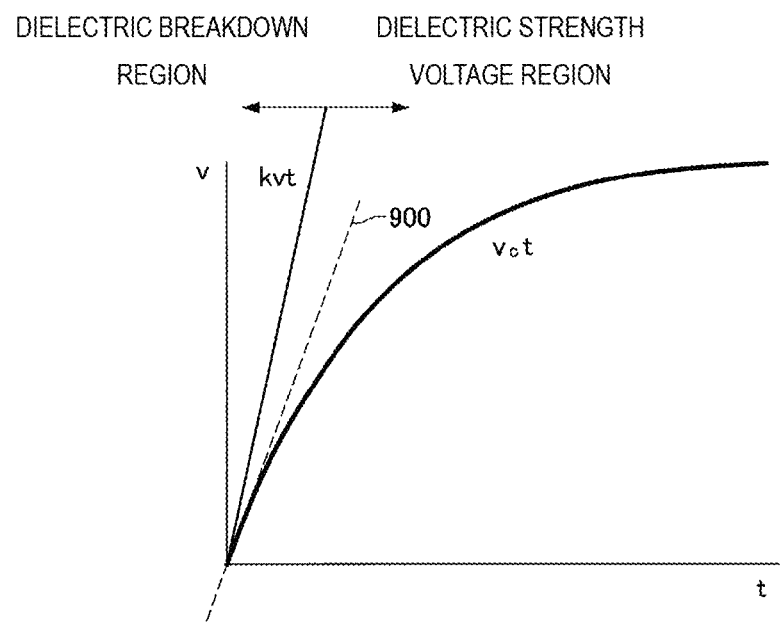
FIG. 18 is an explanatory view illustrating the relationship between a charging voltage of the capacitor C1 and a contact disconnection withstanding voltage limit.

FIG. 18 is an explanatory view illustrating the relationship between charging voltage of the capacitor C1 and withstanding voltage limit at contact disconnection (contact disconnection withstanding voltage limit). Hereinafter, the relationship between the charging voltage of the capacitor C1 and the contact disconnection withstanding voltage limit will be described with the seventh configuration example used as an illustration. The same can also be said for the other configuration examples.

When the plug electrode P1 and the auxiliary terminal 710 illustrated in FIG. 13 get disconnected from each other when breaking current from the direct current power supply, a dielectric strength voltage Vd calculated from the distance between the plug electrode P1 and the auxiliary terminal 710 is the product of a dielectric strength voltage coefficient and the distance between the electrodes. Meanwhile, charging to the capacitor C1 is started by the plug electrode P1 disconnecting from the auxiliary terminal 710.

A charging voltage Vc of the capacitor C1 is determined by the relationship between the capacitor C1 and the resistance value of the load 20. As illustrated in FIG. 18, the amount of increase in the charging voltage Vc gradually decreases over time t. That is, the slope of a tangent of the graph of the charging voltage Vc gradually becomes smaller over time t.

If the relationship between the dielectric strength voltage Vd and the charging voltage Vc of the capacitor C1 satisfies Vd >Vc, dielectric breakdown will not occur, and nor will an arc occur. In particular, the slope of the charging voltage Vc of the capacitor C1 is greatest immediately after disconnection, as indicated by the broken line denoted by reference numeral 900 in FIG. 18, and this value is a coefficient determined by a time constant T=1/CR, such that Vc (t=0) =e/CR. Note that, e is a voltage value of power supplied from the direct current power supply, C is a capacitance value of the capacitor C1, and R is the resistance value of the load 20.

Also, an inter-contact withstanding voltage Vdt from the disconnection is Vdt=kvt. k is a dielectric strength voltage coefficient, and v is the disconnection speed of the contact (the plug electrode P1 and the auxiliary terminal 710). Also, t indicates the time from disconnection of the contact (the plug electrode P1 and the auxiliary terminal 710).

Therefore, it is possible to prevent an arc from occurring when the plug electrode P1 is disconnected from the auxiliary terminal 710, by setting the relationship between the disconnection speed of the plug electrode P1 and the auxiliary terminal 710, and the capacitance C of the capacitor C1, so as to maintain the relationship of Vd>Vc, that is, kv>e/CR.

When kv>e/CR is transformed, C>e/(Rkv) is obtained, and when it is assumed that i indicates the circuit current that flows to the switching device 700, i=e/R is obtained, so the condition of the capacitance of the capacitor C1 when preventing an arc from occurring at disconnection is C>i/ (kv). The formula need only be the capacitance of the capacitor C1>circuit current/(dielectric strength voltage of inter-electrode gas×contact disconnection speed).

That is, the disconnection speed when the plug electrode P1 is disconnected from the auxiliary terminal 710, and the capacitance of the capacitor C1, are set such that the dielectric strength voltage rises faster than the rising speed of the charging voltage of the capacitor C1, in a case where the resistance of the load 20 that receives a supply of current from the direct current power supply is minimal.

1.2.9. Application Example

Figure 19:
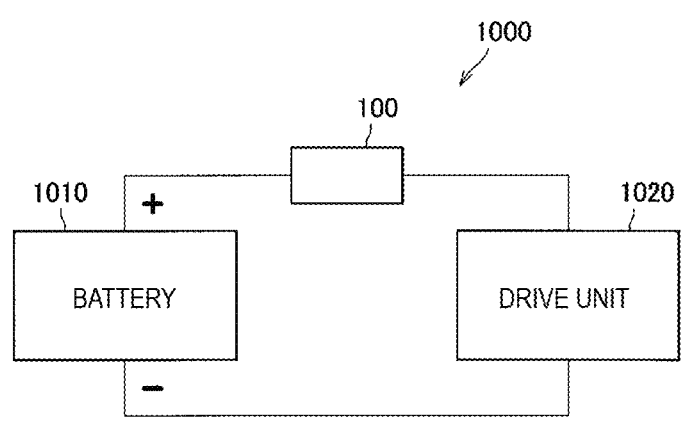
FIG. 19 is an explanatory view of a functional configuration example of a movable body 1000 that includes the switching device 100.

FIG. 19 is an explanatory view of a functional configuration example of a movable body 1000 provided with the switching device 100. The movable body 1000 may be, for example, a movable body that uses gasoline as the power source, such as a gasoline-powered vehicle, or a movable body that mainly uses a chargeable/dischargeable battery as the power source, such as an electric vehicle, a hybrid vehicle, or an electric motorbike. FIG. 19 illustrates an example of a case in which a battery 1010, and a drive unit 1020 driven by power supplied from the battery, are provided in the movable body 1000. The drive unit 1020 can include accessories provided in a vehicle, such as wipers, power windows, lights, a car navigation system, and an air conditioner, as well as a device that drives the movable body 1000 such as a motor, and the like.

Also, the movable body 1000 illustrated in FIG. 19 is provided with the switching device 100 midway in the path along which direct current power is supplied from the battery 1010 to the drive unit 1020. The movable body 1000 illustrated in FIG. 19 is able to suppress an occurrence of arc discharge at times such as when temporarily attaching and detaching the battery 1010, for example, by the switching device 100 being provided in the path along which direct current power is supplied from the battery 1010 to the drive unit 1020.

Note that FIG. 19 illustrates an example in which the movable body 1000 is provided with only one switching device 100, but the present disclosure is not limited to this example. That is, a plurality of the switching devices 100 may be provided midway in the path along which direct current power is supplied. Also, the switching device 100 may be provided not only midway in a path along which direct current power is supplied from the battery 1010 to the drive unit 1020, but in another location, for example, midway in a path through which the battery 1010 is charged with direct current power. The movable body 1000 is able to safely charge the battery 1010 with direct current power by providing the switching device 100 midway in a path through which the battery 1010 is charged with direct current power.

Also, FIG. 19 illustrates the switching device 100 of the first configuration example for switching between supplying and breaking direct current power from the battery 1010 to the drive unit 1020, but it of course goes without saying that a switching device of another configuration example may also be used.

2. SUMMARY

As described above, according to the embodiment of the present disclosure, a time lag is provided between contact and disconnection of the two contacts when switching between supplying and breaking current from the direct current power supply. Also, the capacitance of the capacitor used in the switching device is selected such that the dielectric strength voltage rises faster than the rising speed of the charging voltage of the capacitor C1, in a case where the resistance of the load 20 that receives a supply of current from the direct current power supply is minimal.

The switching device according to the embodiment of the present disclosure makes it possible to prevent both a contact welding when current is supplied, and an occurrence of an arc when current is broken, by providing a time lag between connection and disconnection of two contacts when switching between supplying and breaking current from a direct current power supply, and using a capacitor having an appropriate capacitance.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)
A switching device including:
a first circuit breaker mechanism provided in a path of current output from a direct current power supply;
a second circuit breaker mechanism that is provided in parallel with the first circuit breaker mechanism in the path of current output from the direct current power supply, and is connected before the first circuit breaker mechanism when current output from the direct current power supply is supplied, and is disconnected after the first circuit breaker mechanism when current output from the direct current power supply is broken;
a capacitor provided between the direct current power supply and the second circuit breaker mechanism; and
a discharging unit that is connected in parallel with the capacitor and discharges a charge stored in the capacitor when current output from the direct current power supply is broken,
in which a disconnection speed when the first circuit breaker mechanism is disconnected and a capacitance of the capacitor are set such that a dielectric strength voltage rises faster than a rising speed of a charging voltage of the capacitor, in a case where resistance of a load that receives a supply of the current from the direct current power supply is minimal.

(2)
The switching device according to (1), in which
the first circuit breaker mechanism and the second circuit breaker mechanism include make contacts of two circuits, and
the switching device further includes a diode downstream of the capacitor, while a direction of current flowing from the direct current power supply is considered as a forward direction.

(3)
The switching device according to (1), in which
the first circuit breaker mechanism and the second circuit breaker mechanism are sockets configured to flow current to a plug provided in the load.

(4)
A switching device including:
a first switch provided in a path of current output from a direct current power supply;
a second switch that is provided in parallel with the first switch in the path of current output from the direct current power supply, and turns on after the first switch is turned on, and turns off after a predetermined period of time after the first switch is turned off;
a capacitor that gets connected in parallel with the first switch when the second switch turns on after the first switch is turned on; and
a discharging unit that discharges a charge stored in the capacitor, after the second switch is turned off,
in which a disconnection speed when the first switch is disconnected from an on state and a capacitance of the capacitor are set such that a dielectric strength voltage rises faster than a rising speed of a charging voltage of the capacitor, in a case where resistance of a load that receives a supply of current from the direct current power supply is minimal.

(5)
The switching device according to (4), in which
states of the second switch are switched by elastic force generated as states the first switch are switched.

(6)
The switching device according to (5), further including:
an elastic body between the first switch and the second switch.

(7)
The switching device according to (5), in which
the first switch is a slide switch, and the second switch is a switch in which a contact switches by elastic force of an elastic body in response to a sliding operation of the first switch.

(8)

The switching device according to (4), in which
states of the second switch are switched by magnetic force that is generated or canceled as states of the first switch are switched.

(9)

The switching device according to (8), in which
the first switch is a single pole switch, and the second switch is a mechanical relay that is turned on by current supplied from the direct current power supply when the first switch turns on.

(10)

The switching device according to (8), further including:
a third switch that is provided in series with the first switch and switches between on and off in conjunction with the first switch,
in which the second switch is a mechanical relay that is turned on by current supplied from the direct current power supply from between the first switch and the third switch when the first switch turns on.

(11)

The switching device according to (8), in which
the first switch is a first mechanical relay that is turned on by current supplied from an external power supply that is different from the direct current power supply, and the second switch is a second mechanical relay that is turned on by current supplied from the external power supply when the first switch turns on.

(12)

The switching device according to (4), in which
the first switch and the second switch include slide switches that operate in conjunction with each other.

(13)

A movable body including:
the switching device according to (4).

(14)

A power supply system including:
a battery that supplies direct current power;
a drive unit that is driven by direct current power supplied from the battery; and
at least one of the switching devices according to (1) or (4), provided between the battery and the drive unit.

(15)

A switching method including:
connecting a first circuit breaker mechanism provided in a path of current output from a direct current power supply after connecting a second circuit breaker mechanism provided in parallel with the first circuit breaker mechanism in the path of current output from the direct current power supply, when supplying current output from the direct current power supply; and
disconnecting the second circuit breaker mechanism after disconnecting the first circuit breaker mechanism, when breaking current output from the direct current power supply,
in which a disconnection speed when the first circuit breaker mechanism is disconnected and a capacitance of a capacitor provided between the direct current power supply and the second circuit breaker mechanism are set such that a dielectric strength voltage rises faster than a rising speed of a charging voltage of the capacitor, in a case where resistance of a load that receives a supply of current from the direct current power supply is minimal.

(16)

A switching method including:
after a first switch provided in a path of current output from a direct current power supply is turned on, turning on a second switch provided in parallel with the first switch in the path for current output from the direct current power supply, and connecting a capacitor in parallel with the first switch;
turning off the second switch after a predetermined period of time after the first switch is turned off; and
discharging a charge stored in the capacitor after the second switch is turned off,
in which a disconnection speed when the first switch is disconnected from an on state and a capacitance of the capacitor are set such that a dielectric strength voltage rises faster than a rising speed of a charging voltage of the capacitor, in a case where resistance of a load that receives a supply of current from the direct current power supply is minimal.

REFERENCE SIGNS LIST 20 load
100, 200, 300, 400, 500, 600, 700, 800 switching device

The invention claimed is:

1. A switching device comprising:
a first circuit breaker mechanism provided in a path of current output from a direct current power supply;
a second circuit breaker mechanism that is provided in parallel with the first circuit breaker mechanism in the path of current output from the direct current power supply, and is connected before the first circuit breaker mechanism when current output from the direct current power supply is supplied, and is disconnected after the first circuit breaker mechanism when current output from the direct current power supply is broken;
a capacitor provided between the direct current power supply and the second circuit breaker mechanism; and
a discharging unit that is connected in parallel with the capacitor and discharges a charge stored in the capacitor when current output from the direct current power supply is broken,
wherein a disconnection speed when the first circuit breaker mechanism is disconnected and a capacitance of the capacitor are set such that a dielectric strength voltage rises faster than a rising speed of a charging voltage of the capacitor, in a case where resistance of a load that receives a supply of the current from the direct current power supply is minimal.

2. The switching device according to claim 1, wherein
the first circuit breaker mechanism and the second circuit breaker mechanism include make contacts of two circuits, and
the switching device further comprises a diode downstream of the capacitor, while a direction of current flowing from the direct current power supply is considered as a forward direction.

3. The switching device according to claim 1, wherein
the first circuit breaker mechanism and the second circuit breaker mechanism are sockets configured to flow current to a plug provided in the load.

4. A switching device comprising:
a first switch provided in a path of current output from a direct current power supply;
a second switch that is provided in parallel with the first switch in the path of current output from the direct current power supply, and turns on after the first switch is turned on, and turns off after a predetermined period of time after the first switch is turned off;

a capacitor that gets connected in parallel with the first switch when the second switch turns on after the first switch is turned on; and a discharging unit that discharges a charge stored in the capacitor, after the second switch is turned off, wherein a disconnection speed when the first switch is disconnected from an on state and a capacitance of the capacitor are set such that a dielectric strength voltage rises faster than a rising speed of a charging voltage of the capacitor, in a case where resistance of a load that receives a supply of current from the direct current power supply is minimal.

5. The switching device according to claim 4, wherein states of the second switch are switched by elastic force generated as states the first switch are switched.

6. The switching device according to claim 5, further comprising:

an elastic body between the first switch and the second switch.

7. The switching device according to claim 5, wherein the first switch is a slide switch, and the second switch is a switch in which a contact switches by elastic force of an elastic body in response to a sliding operation of the first switch.

8. The switching device according to claim 4, wherein states of the second switch are switched by magnetic force that is generated or canceled as states of the first switch are switched.

9. The switching device according to claim 8, wherein the first switch is a single pole switch, and the second switch is a mechanical relay that is turned on by current supplied from the direct current power supply when the first switch turns on.

10. The switching device according to claim 8, further comprising:

a third switch that is provided in series with the first switch and switches between on and off in conjunction with the first switch, wherein the second switch is a mechanical relay that is turned on by current supplied from the direct current power supply from between the first switch and the third switch when the first switch turns on.

11. The switching device according to claim 8, wherein the first switch is a first mechanical relay that is turned on by current supplied from an external power supply that is different from the direct current power supply, and the second switch is a second mechanical relay that is turned on by current supplied from the external power supply when the first switch turns on.

12. The switching device according to claim 4, wherein the first switch and the second switch include slide switches that operate in conjunction with each other.

13. A movable body comprising:
the switching device according to claim 1.

14. A power supply system comprising:
a battery that supplies direct current power;
a drive unit that is driven by direct current power supplied from the battery; and
the switching device according to claim 1, provided between the battery and the drive unit.

15. A switching method comprising:
connecting a first circuit breaker mechanism provided in a path of current output from a direct current power supply after connecting a second circuit breaker mechanism provided in parallel with the first circuit breaker mechanism in the path of current output from the direct current power supply, when supplying current output from the direct current power supply; and
disconnecting the second circuit breaker mechanism after disconnecting the first circuit breaker mechanism, when breaking current output from the direct current power supply,
wherein a disconnection speed when the first circuit breaker mechanism is disconnected and a capacitance of a capacitor provided between the direct current power supply and the second circuit breaker mechanism are set such that a dielectric strength voltage rises faster than a rising speed of a charging voltage of the capacitor, in a case where resistance of a load that receives a supply of current from the direct current power supply is minimal.

16. A switching method comprising:
after a first switch provided in a path of current output from a direct current power supply is turned on, turning on a second switch provided in parallel with the first switch in the path for current output from the direct current power supply, and connecting a capacitor in parallel with the first switch;
turning off the second switch after a predetermined period of time after the first switch is turned off; and
discharging a charge stored in the capacitor after the second switch is turned off,
wherein a disconnection speed when the first switch is disconnected from an on state and a capacitance of the capacitor are set such that a dielectric strength voltage rises faster than a rising speed of a charging voltage of the capacitor, in a case where resistance of a load that receives a supply of current from the direct current power supply is minimal.

* * * * *